US012615911B2

(12) United States Patent
Lee

(10) Patent No.: US 12,615,911 B2
(45) Date of Patent: Apr. 28, 2026

(54) ELECTROLUMINESCENCE DISPLAY

(71) Applicant: LG Display Co., Ltd., Seoul (KR)

(72) Inventor: MyoungHo Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 712 days.

(21) Appl. No.: 17/973,356

(22) Filed: Oct. 25, 2022

(65) Prior Publication Data

US 2023/0217700 A1 Jul. 6, 2023

(30) Foreign Application Priority Data

Dec. 30, 2021 (KR) ......................... 10-2021-0192850

(51) Int. Cl.
H10K 50/86 (2023.01)
H10K 50/82 (2023.01)
(Continued)

(52) U.S. Cl.
CPC ........... H10K 50/865 (2023.02); H10K 50/82 (2023.02); H10K 50/858 (2023.02); H10K 59/131 (2023.02); *H10K 2102/00* (2023.02)

(58) Field of Classification Search
CPC ...... H10K 50/80; H10K 50/865; H10K 50/88; H10K 59/131; H10K 59/126; H10K 59/12; H10K 59/80; H10K 77/00
See application file for complete search history.

(56) References Cited

U.S. PATENT DOCUMENTS

| | | | |
|---|---|---|---|
| 2003/0234609 A1 | 12/2003 | Aziz et al. | |
| 2004/0256980 A1* | 12/2004 | Tsuchiya | H10K 71/60 313/506 |

(Continued)

FOREIGN PATENT DOCUMENTS

| | | |
|---|---|---|
| KR | 10-2006-0055052 A | 5/2006 |
| KR | 10-2014-0025682 A | 3/2014 |

(Continued)

OTHER PUBLICATIONS

Xie et al, "Reduced ambient reflection of organic light-emitting diodes by utilizing multilayer low-reflection cathodes", 2006, Semiconductor Science and Technology, 21, pp. 1077-1082 (Year: 2006).*

(Continued)

*Primary Examiner* — Bumsuk Won
(74) *Attorney, Agent, or Firm* — Fenwick & West LLP

(57) ABSTRACT

The present disclosure relates to an electroluminescence display having enhanced display quality by preventing external light from being reflected. An electroluminescence display according to the present disclosure comprises: a light shielding layer disposed on a substrate, and including a first metal layer and a second metal layer on the first metal layer; a first buffer layer covering the light shielding layer on the substrate; a gate line disposed on the first buffer layer and not overlapped with the light shielding layer, the gate line including a third metal layer and a fourth metal layer on the third metal layer; a passivation layer covering the gate line; a planarization layer on the passivation layer; and an emission element including a first electrode, an emission layer and a second electrode sequentially stacked on the planarization layer.

20 Claims, 8 Drawing Sheets

(51) Int. Cl.
    *H10K 50/858*     (2023.01)
    *H10K 59/131*     (2023.01)
    *H10K 102/00*     (2023.01)

(56)           References Cited

U.S. PATENT DOCUMENTS

| | | | |
|---|---|---|---|
| 2014/0042396 A1* | 2/2014 | Yang | H10K 59/8792 257/40 |
| 2014/0054554 A1* | 2/2014 | Lee | H10H 20/813 257/40 |
| 2018/0061908 A1* | 3/2018 | Shim | H10K 59/1213 |
| 2018/0123078 A1 | 5/2018 | Byun et al. | |
| 2019/0103060 A1* | 4/2019 | Kang | H10D 86/60 |
| 2022/0037419 A1* | 2/2022 | Ma | H10K 59/8792 |
| 2022/0131018 A1* | 4/2022 | Jeon | H10K 59/65 |
| 2023/0189564 A1* | 6/2023 | Zhang | H10D 86/441 257/71 |

FOREIGN PATENT DOCUMENTS

| | | |
|---|---|---|
| KR | 10-2016-0067314 A | 6/2016 |
| KR | 10-2018-0002947 A | 1/2018 |
| KR | 10-2018-0046229 A | 5/2018 |

OTHER PUBLICATIONS

European Patent Office, Extended European Search Report, European Patent Application No. 22204180.8, Jun. 12, 2023, nine pages.
Korean Intellectual Property Office, Office Action, Korean Patent Application No. 10-2021-0192850, Aug. 4, 2025, 16 pages.

\* cited by examiner

FIG. 3

ELECTROLUMINESCENCE DISPLAY

CROSS-REFERENCE TO RELATED APPLICATIONS

This application claims the benefit of the Korean Patent Application No. 10-2021-0192850 filed on Dec. 30, 2021, which is hereby incorporated by reference in its entirety.

BACKGROUND

Field of the Invention

The present disclosure relates to an electroluminescence display having enhanced display quality by preventing external light from being reflected. Especially, the present disclosure relates to a bottom emission type electroluminescence display including a cathode electrode and signal lines having an external light reflection suppressing structure.

Discussion of the Related Art

Recently, various type of display such as the cathode ray tubes (CRTs), the liquid crystal displays (LCDs), the plasma display panels (PDPs) and the electroluminescent displays have been developed. These various types of display are used to display image data of various products such as computer, mobile phones, bank deposit and withdrawal devices (ATMs), and vehicle navigation systems according to their unique characteristics and purposes.

In the electroluminescence display that is a self-luminous display device with excellent display quality, an external light reflection suppressing structure can be accomplished by disposing a polarization element in front of the display panel. The polarizing element for suppressing external light reflection may have a problem of reducing the amount of light provided by the display device, and it is a very expensive element. Therefore, there is a demand for the development of a structure for an electroluminescence display capable of suppressing external light reflection without adding a polarizing element.

SUMMARY

The purpose of the present disclosure, as for solving the problems described above, is to provide an electroluminescence display having a low reflection cathode electrode capable of preventing display quality deterioration due to the reflection of the external light by the cathode electrode. Another purpose of the present disclosure is to provide an electroluminescence display having a low-reflection line and low-reflection electrode, in addition to the cathode electrode, it is possible to prevent the display quality from being deteriorated due to the reflection of the external light by various lines or wirings formed of the metal materials. Still another purpose of the present disclosure is to provide an electroluminescence display having a structure capable of preventing a defect in electrical contact in a connection part between the signal lines and the cathode electrode which have the low reflection structure.

In order to accomplish the above mentioned purposes of the present disclosure, an electroluminescence display according to the present disclosure comprises: a light shielding layer disposed on a substrate, and including a first metal layer and a second metal layer on the first metal layer; a first buffer layer covering the light shielding layer on the substrate; a gate line disposed on the first buffer layer and not overlapped with the light shielding layer, the gate line including a third metal layer and a fourth metal layer on the third metal layer; a passivation layer covering the gate line; a planarization layer on the passivation layer; and an emission element including a first electrode, an emission layer and a second electrode sequentially stacked on the planarization layer.

In an example embodiment, the second electrode includes: a first cathode layer disposed on the emission layer; a second cathode layer disposed on the first cathode layer; and a third cathode layer disposed on the second cathode layer.

In an example embodiment, the first cathode layer has a first metal material with a first thickness in range of 100 Å to 200 Å. The second cathode layer has a conductive organic material including a domain material and a dopant. The third cathode layer has a second metal material with a second thickness in range of 2,000 Å to 4,000 Å.

In an example embodiment, the first metal layer and the third metal layer include a metal oxide material with a thickness in range of 100 Å to 500 Å. The second metal layer and the fourth metal layer include a metal material with a thickness in range of 2,000 Å to 4,000 Å.

In an example embodiment, the first metal layer include a metal oxide material with a thickness in range of 100 Å to 500 Å. The second metal layer and the fourth metal layer include a first metal material with a thickness in range of 2,000 Å to 4,000 Å. The third metal layer includes a second metal material with a thickness in range of 100 Å to 500 Å.

In an example embodiment, the electroluminescence display further comprises a second buffer layer between the first metal layer and the substrate. The first metal layer and the third metal layer have a first metal material with a thickness in range of 100 Å to 500 Å. The second metal layer and the fourth metal layer have a second metal material with thickness in range of 2,000 Å to 4,000 Å.

In an example embodiment, the first buffer layer and the second buffer layer are disposed between the gate line and the substrate.

In an example embodiment, the first buffer layer is patterned to selectively cover the light shielding layer. The second buffer layer is disposed between the light shielding layer and the substrate without the first buffer layer.

In an example embodiment, the light shielding layer includes: a light shielding region overlapping with the semiconductor layer; and a signal line region including a data line and a driving current line, and being separated from the light shielding region.

In an example embodiment, the electroluminescence display further comprises: a semiconductor layer overlapping with the light shielding region of the light shielding layer on the first buffer layer; a gate insulating layer covering the semiconductor layer; and a gate electrode, a source electrode and a drain electrode formed as same material with the gate line on the gate insulating layer. The gate electrode overlaps with a middle portion of the semiconductor layer, the source electrode contacts one side of the semiconductor layer and the drain electrode contact another side of the semiconductor layer.

In an example embodiment, the second metal layer of the light shielding layer includes a metal material with a thickness in range of 2,000 Å to 4,000 Å. The third metal layer of the data line includes a metal material with a thickness in range of 100 Å to 500 Å. The second metal layer of the data line contacts the third metal layer of the source electrode.

In an example embodiment, the first metal layer and the third metal layer include molybdenum-titanium oxide material. The second metal layer and the fourth metal layer include any one of copper, aluminum, silver and gold.

In an example embodiment, the first metal layer includes molybdenum-titanium oxide material. The second metal layer and the fourth metal layer include any one of copper, aluminum, silver and gold. The third metal layer includes any one of molybdenum, titanium and molybdenum-titanium alloy.

In an example embodiment, the first metal layer and the third metal layer include any one of molybdenum, titanium and molybdenum-titanium alloy. The second metal layer and the fourth metal layer include at least one of copper, aluminum, silver and gold.

In still another embodiment, an electroluminescent display comprises a plurality of transistors disposed on a substrate; a light emitting element electrically coupled to at least one of the transistors; a light shielding layer including a first layer formed of a first material having a first refractive index and a first thickness, and a second layer formed of a second material having a second refractive index and a second thickness; and one or more signal lines electrically coupled to corresponding ones of the plurality of transistors, at least one of the signal lines including a third layer formed of a third material having a third refractive index and a third thickness, and a fourth layer formed of a fourth material having a fourth refractive index and a fourth thickness, wherein first light reflected from a first surface of the first layer and second light reflected from a first surface of the second layer contacting a second surface of the first layer being at least partially canceled out; and wherein third light reflected from a first surface of the third layer and fourth light reflected from a first surface of the fourth layer contacting a second surface of the third layer being at least partially canceled out.

The electroluminescent display according to the present disclosure may include a cathode electrode having a low-reflection structure for the bottom emission type, so it is remarkably suppressed or reduced the external light reflection. Further, applying the low-reflection structure to other lines including another metal material, the external light reflection by the lines may be suppressed or reduced. Especially, the low-reflection structure for the lines may include a first metal layer having thickness for ensuring the transparent property and a second metal layer ensuring reflectance, so the external light reflection may be suppressed by using the phase destructive interference between the reflected lights. Therefore, when interconnecting lines with metals in different layers, a metal-to-metal junction may be formed at the contact portion, so that electrical contact failure may not occur. The electroluminescence display according to the present disclosure may provide excellent video image quality by suppressing reflection of external light. In addition, since the metal layer is only used without the oxide layer in the external light reflection suppression structure, it is possible to prevent a contact failure at the contact portion with another metal layer.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 3 is a plan view illustrating a structure of the pixels disposed in the electroluminescence display according to the present disclosure.

DETAILED DESCRIPTION OF THE DISCLOSURE

Figure 1:
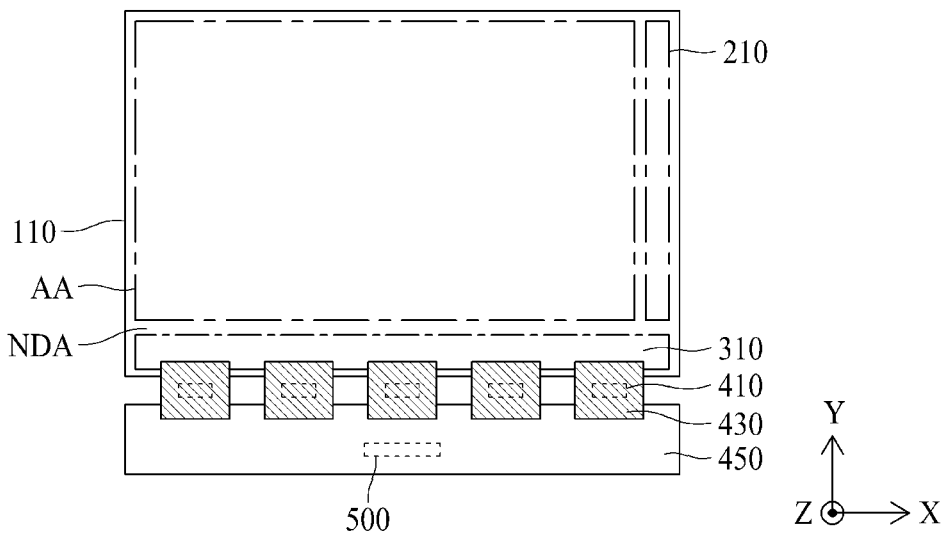
FIG. 1 is a plane view illustrating a schematic structure of an electroluminescence display according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween. Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display device according to the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the scale shown in the drawings.

Hereinafter, referring to the attached figures, the present disclosure will be explained. FIG. 1 is a plane view illustrating a schematic structure of an electroluminescence display according to the present disclosure. In FIG. 1, X-axis refers to the direction parallel to the scan line, Y-axis refers to the direction of the data line, and Z-axis refers to the height direction of the display device.

Referring to FIG. 1, the electroluminescence display comprises a substrate 110, a gate (or scan) driver 210, a data pad portion 310, a source driving IC (Integrated Circuit) 410, a flexible film 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The display area AA, which is an area for representing the video images, may be defined as the majority middle area of the substrate 110, but it is not limited thereto. In the display area AA, a plurality of scan lines (or gate lines), a plurality of data lines and a plurality of pixels may be formed or disposed. Each of pixels may include a plurality of sub pixels. Each of sub pixels includes the scan line and the data line, respectively.

The non-display area NDA, which is an area not representing the video images, may be disposed adjacent to the display area AA. For example, the non-display area NDA may be defined at the circumference areas of the substrate 110 surrounding all or some of the display area AA. In the non-display area NDA, the gate driver 210 and the data pad portion 310 may be formed or disposed.

The gate driver 210 may supply the scan (or gate) signals to the scan lines according to the gate control signal received from the timing controller 500. The gate driver 210 may be formed at the non-display area NDA at any one side of outside of the display area AA on the substrate 110, as a GIP (Gate driver In Panel) type. GIP type means that the gate driver 210 is directly formed on the substrate 110.

The data pad portion 310 may supply the data signals to the data line according to the data control signal received from the timing controller 500. The data pad portion 310 may be made as a driver chip and mounted on the flexible film 430. Further, the flexible film 430 may be attached at the non-display area NDA at any one side of outside of the display area AA on the substrate 110, as a TAB (Tape Automated Bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible film 430 as a COF (chip on film) or COP (chip on plastic) type.

The flexible film 430 may include a plurality of first link lines connecting the data pad portion 310 to the source driving IC 410, and a plurality of second link lines connecting the data pad portion 310 to the circuit board 450. The flexible film 430 may be attached on the data pad portion 310 using an anisotropic conducting film, so that the data pad portion 310 may be connected to the first link lines of the flexible film 430.

The circuit board 450 may be attached to the flexible film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 210 and a source control signal for controlling the source driving IC 410, based on the timing signal. The timing controller 500 may supply the gate control signal to the gate driver 210 and supply the source control signal to the source driving IC 410. Depending on the product types, the timing controller 500 may be formed as one chip with the source driving IC 410 and mounted on the substrate 110.

First Embodiment

Figure 2:
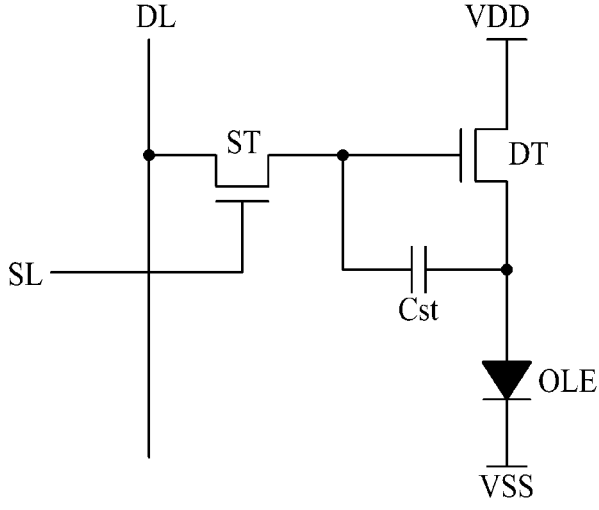
FIG. 2 is a circuit diagram illustrating a structure of one pixel included in the electroluminescence display according to the present disclosure.
Figure 3:
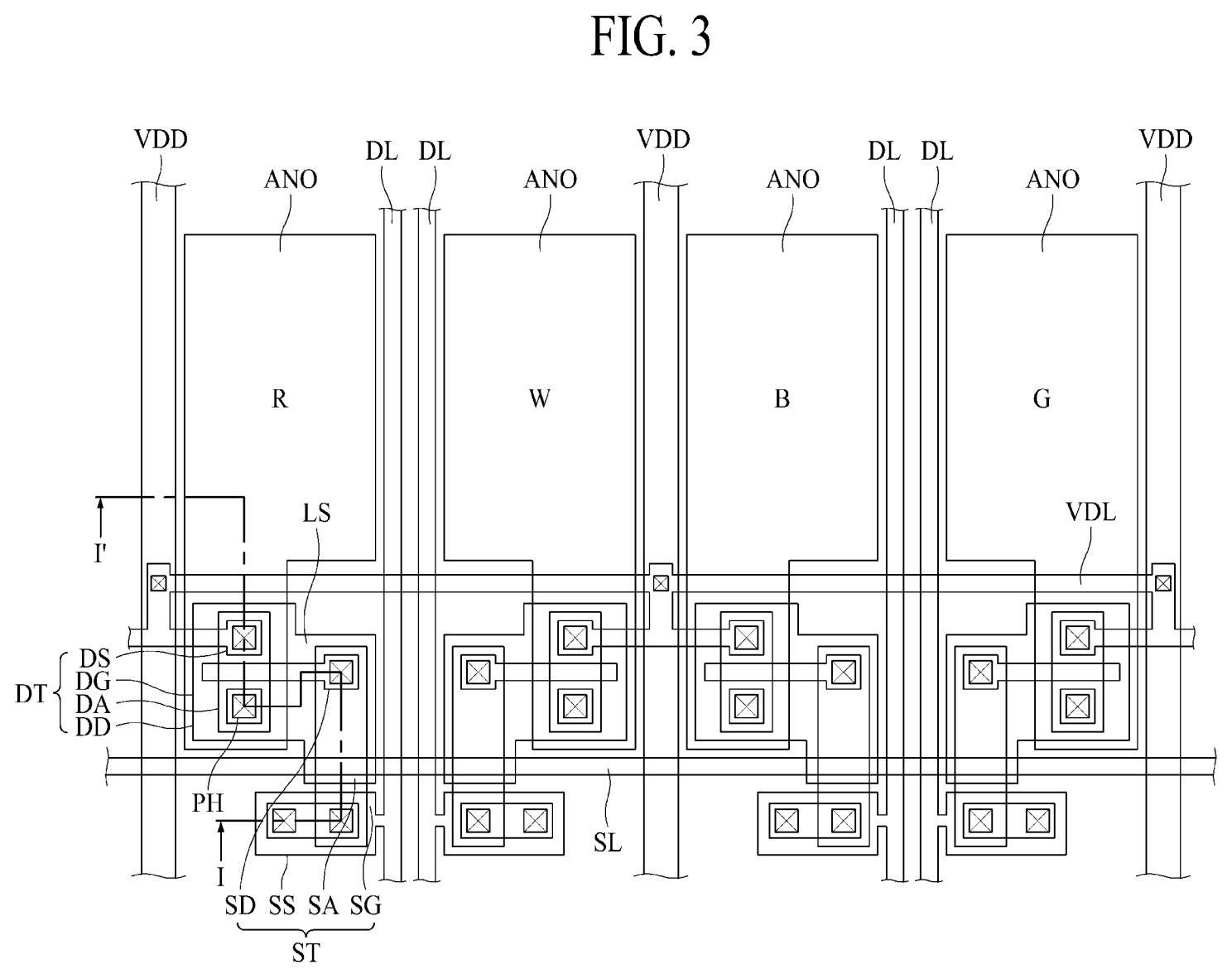
Figure 4:
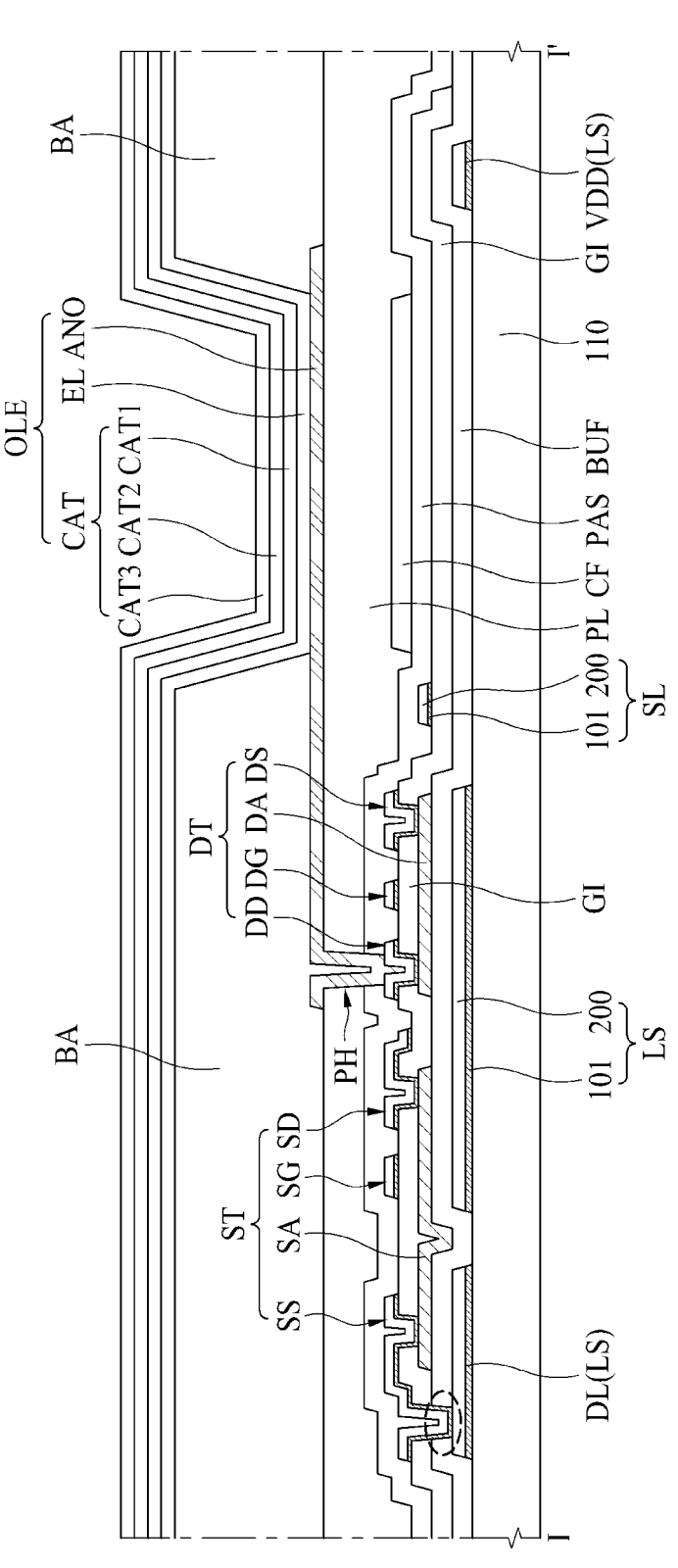
FIG. 4 is a cross-sectional view along to cutting line I-I' in FIG. 3, for illustrating the low reflecting structure of the electroluminescence display according to a first embodiment of the present disclosure.

Hereinafter, referring to FIGS. 2 to 4, a preferred embodiment of the present disclosure will be explained. FIG. 2 is a circuit diagram illustrating a structure of one pixel according to the present disclosure. FIG. 3 is a plan view illustrating a structure of the pixels according to the present disclosure. FIG. 4 is a cross-sectional view along cutting line I-I' in FIG. 3, for illustrating the low reflecting structure of the electroluminescent display according to a first embodiment of the present disclosure.

Referring to FIGS. 2 to 4, one pixel of the light emitting display may be defined by a scan line SL, a data line DL and a driving current line VDD. One pixel of the light emitting display may include a switching thin film transistor ST, a driving thin film transistor DT, a light emitting diode OLE and a storage capacitance Cst. The driving current line VDD may be supplied with a high-level voltage for driving the light emitting diode OLE.

A switching thin film transistor ST and a driving thin film transistor DT may be formed on a substrate 110. For example, the switching thin film transistor ST may be disposed at the portion where the scan line SL and the data line DL intersect. The switching thin film transistor ST may include a switching gate electrode SG, a switching source electrode SS and a switching drain electrode SD. The switching gate electrode SG may be connected to the scan line SL. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light diode OLE of the selected pixel by the switching thin film transistor ST. The driving thin film transistor DT may include a driving gate electrode DG, a driving source electrode DS and a driving drain electrode DD. The driving gate electrode DG may be connected to the switching drain electrode SD of the switching thin film transistor ST. For example, the driving gate electrode DG may be connected to the switching drain electrode SD via the drain contact hole DH penetrating the gate insulating layer GI. The driving source electrode DS may be connected to the driving current line VDD, and the driving drain electrode DD may be connected to an anode electrode ANO of the light emitting diode OLE. A storage capacitance Cst may be disposed between the driving gate electrode DG of the driving thin film transistor DT and the anode electrode ANO of the light emitting diode OLE.

The driving thin film transistor DT may be disposed between the driving current line VDD and the light emitting diode OLE. The driving thin film transistor DT may control the amount of electric currents flowing to the light emitting diode OLE from the driving current line VDD according to the voltage level of the driving gate electrode DG connected to the switching drain electrode SD of the switching thin film transistor ST.

The light emitting diode OLE may include an anode electrode ANO, a light emitting layer EL and a cathode electrode CAT. The light emitting diode OLE may emit the light according to the amount of the electric current controlled by the driving thin film transistor DT. In other word, the light emitting diode OLE may be driven by the voltage differences between the low-level voltage and the high-level voltage controlled by the driving thin film transistor DT. The anode electrode ANO of the light emitting diode OLE may be connected to the driving drain electrode DD of the driving thin film transistor DT, and the cathode electrode CAT may be connected to a low-level voltage line Vss where a low-level potential voltage is supplied. That is, the light emitting diode OLE may be driven by the high-level voltage controlled by the driving thin film transistor DT and the low-level voltage supplied from the low-level voltage line VSS.

Referring to FIG. 4, the cross-sectional structure of an electroluminescence display according to the first embodiment of the present disclosure will be explained. The light shielding layer LS may be disposed on the substrate 110. The light shielding layer LS may include a light shielding region and a signal line region. The signal line region of the light shielding layer LS may include the data line DL and the driving current line VDD. Further, the light shielding region of the light shielding layer LS may be disposed as being apart from the data line DL and the driving current line VDD with a predetermined distance, and having an island shape overlapping with the switching semiconductor layer SA of the switching thin film transistor ST and the driving semiconductor layer DA of the driving thin film transistor DT. The light shielding layer LS not used for any conductive line may block the external light from intruding into the semiconductor layer SA and DA to reduce deterioration of the characteristics of the semiconductor layers SA and DA. In one embodiment, the light shielding layer LS may be disposed as being overlapped with the channel regions in the semiconductor layers SA and DA which are overlapped with the gate electrodes SG and DG, respectively. In addition, the light shielding layer LS may be disposed as being over-lapped with some portions of the source-drain electrodes SS, SD, DS and DD respectively contacting the semiconductor layers SA and DA.

On the light shielding layer LS, a buffer layer BUF is disposed as covering the entire surface of the substrate 110. On the buffer layer BUF, the switching semiconductor layer SA and the driving semiconductor layer DA are formed. It is preferable that the channel regions in the semiconductor layers SA and DA are disposed to overlap with the light shielding layer LS.

A gate insulating layer GI may be disposed on the surface of the substrate 110 having the semiconductor layers SA and DA. On the gate insulating layer GI, a switching gate electrode SG may be formed to overlap with the switching semiconductor layer SA and a driving gate electrode DG may be formed to overlap with the driving semiconductor layer DA. On both sides of the switching gate electrode SG, a switching source electrode SS contacting one side of the switching semiconductor layer SA and apart from the switching gate electrode SG may be formed, and a switching drain electrode SD contacting the other side of the switching semiconductor layer SA and apart from the switching gate electrode SG may be formed. In addition, on the both sides of the driving gate electrode DG, a driving source electrode DS contacting one side of the driving semiconductor layer DA and apart from the driving gate electrode DG may be formed, and a driving drain electrode DD contacting the other side of the driving semiconductor layer DA and apart from the driving gate electrode DG may be formed.

The gate electrodes SG and DG and the source-drain electrodes SS, SD, DS and DD are formed on the same layer, but they are separated from each other. The switching source electrode SS may be connected to the data line DL formed as a part of the signal line region of the light shielding layer LS via a contact hole penetrating the gate insulating layer GI and the buffer layer BUF. In addition, the driving source electrode DS may be connected to the driving current line VDD formed as another part of the signal region of the light shielding layer LS via another contact hole penetrating the gate insulating layer GI and the buffer layer BUF.

On the substrate 110 having the thin film transistors ST and DT, a passivation layer PAS may be deposited. The passivation layer PAS may be formed of inorganic layer such as silicon oxide or silicon nitride. A color filter CF may be formed on the passivation layer PAS. The color filter CF may be an element for representing color allocated at each pixel. For an example, one color filter CF may have a size and a shape corresponding to the size and the shape of one pixel. For another example, one color filter CF may have a size slightly larger than that of the light emitting diode OLE which will be formed later and may be disposed to overlap the light emitting diode OLE.

A planarization layer PL may be deposited on the color filter CF. The planarization layer PL may be a thin film for flattening or evening the non-uniform surface of the sub-strate 110 on which the thin film transistors ST and DT are formed. To do so, the planarization layer PL may be made of the organic materials. The passivation layer PAS and the planarization layer PL may have a pixel contact hole PH for exposing some portions of the drain electrode DD of the driving thin film transistor DT.

On the surface of the planarization layer PL, an anode electrode ANO may be formed. The anode electrode ANO may be connected to the drain electrode DD of the driving thin film transistor DT via the pixel contact hole PH. The anode electrode ANO may have different elements accord-ing to the emission condition of the light emitting diode OLE. For the bottom emission type in which the emitted light may be provided to the substrate 110, it is preferable that the anode electrode ANO may be made of a transparent conductive material. For the top emission type in which the emitted light may be provided to the direction opposite to the substrate 110, it is preferable that the anode electrode ANO may include a metal material with excellent reflection ratio.

In the case of a large area display device such as a TV set, the cathode electrode CAT disposed on the anode electrode ANO may be formed as one layer as covering a large area. The cathode electrode CAT maintains a uniform low voltage over a wide area. Therefore, in the case of a large-area display device, the cathode electrode CAT may be formed of an opaque metal material in order to maintain a low sheet resistance. Therefore, in the case of a large-area display device, the bottom emission type structure is used. For the bottom emission type, the anode electrode ANO may be made of a transparent conductive material. For example, the anode electrode ANO may include oxide conductive mate-rials such as indium-zin-oxide (IZO) or indium-tin-oxide (ITO).

On the anode electrode ANO, a bank BA may be formed. The bank BA may define an emission area by covering the circumference area of the anode electrode ANO and expos-ing most middle areas of the anode electrode ANO.

An emission layer EL may be deposited on the anode electrode ANO and the bank BA. The emission layer EL may be deposited over the entire surface of the display area AA on the substrate 110, to cover the anode electrodes ANO and banks BA. For an example, the emission layer EL may include two or more stacked emission portions for emitting white light. In detail, the emission layer EL may include a first emission layer providing first color light and a second emission layer providing second color light, for emitting the white light by combining the first color light and the second color light.

For another example, the emission layer EL may include at least any one of blue-light emission layer, green-light emission layer and red-light emission layer corresponding to the color allocated to the pixel. In addition, the light emitting diode OLE may further include at least one functional layer for enhancing the light emitting efficiency and/or the service life-time of the emission layer EL.

The cathode electrode CAT may be disposed on the emission layer EL. The cathode electrode CAT may be stacked on the emission layer EL as being in surface contact with each other. The cathode electrode CAT may be formed as one sheet element over the entire area of the substrate 110 commonly connected with the entire emission layers EL disposed at all pixels. In the case of the bottom emission type, the cathode electrode CAT may include metal material having excellent light reflection ratio. For example, the cathode electrode CAT may include at least any one of silver (Ag), aluminum (Al), molybdenum (Mo), gold (Au), mag-nesium (Mg), calcium (Ca), or barium (Ba).

The present disclosure provides a low-reflection structure for preventing the external light from being reflected by the metal materials of the display device. For example, the present disclosure provides a structure for preventing the external light from being reflected by the cathode electrode CAT formed over the entire surface area of the substrate 110. Further, the present disclosure provides a structure for preventing the external light from being reflected by the light shielding layer LS disposed at the closest layer to the substrate 110. In addition, present disclosure provides a structure for preventing the external light from being reflected by some portions of the gate line SL exposed to the bottom surface of the substrate 110 because the exposed portions of the gate line SL are not overlapped with the light shielding layer LS.

Figure 5:
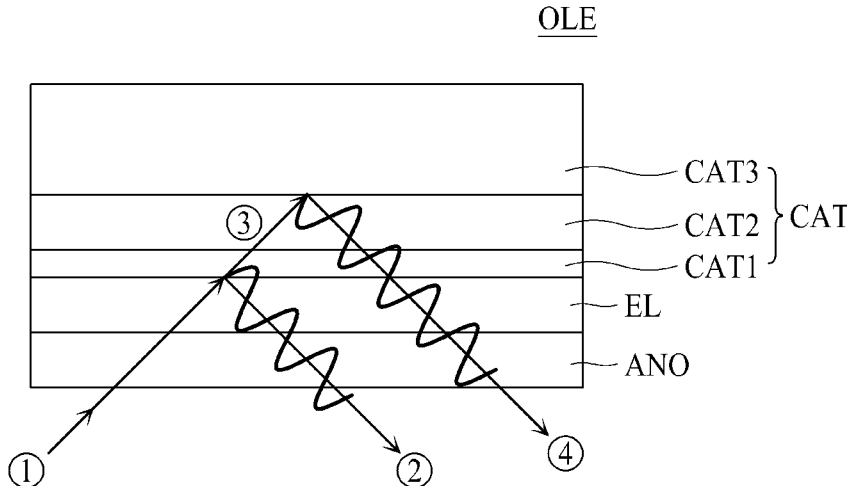
FIG. 5 is an enlarged cross-sectional view explaining a cathode electrode having a low-reflection structure in an electroluminescence display according to the first embodiment of the present disclosure.

Referring to FIG. 5, in the first embodiment of the present disclosure, the structure of the cathode electrode CAT for suppressing the reflection of the external light will be explained. FIG. 5 is an enlarged cross-sectional view explaining a cathode electrode having a low-reflection structure in an electroluminescence display according to the first embodiment of the present disclosure.

In a bottom emission type electroluminescence display according to the present disclosure, the cathode electrode CAT may include three cathode layers. For example, the cathode electrode CAT may include a first cathode layer CAT1, a second cathode layer CAT2 and a third cathode layer CATS sequentially stacked on the emission layer EL. The first cathode layer CAT1 may be firstly stacked on the emission layer EL so as to be in direct surface contact with the emission layer EL. The first cathode layer CAT1 may made of a metal material having relatively low surface resistance. For example, the first cathode layer CAT1 may include any one of aluminum (Al), silver (Ag), molybdenum (Mo), gold (Au), magnesium (Mg), calcium (Ca), or barium (Ba). Considering the manufacturing process and cost, a case in which the first cathode layer CAT1 may be formed of aluminum will be explained as the most preferred example.

In the case that the first cathode layer CAT1 is made of aluminum, it is preferable that the first cathode layer CAT1 may be formed with a thickness of 100 Å to 200 Å. The metallic materials such as aluminum are opaque and relatively highly reflective. However, as aluminum is formed very thin, light may pass through the aluminum thin layer. For example, for thin aluminum layer having a thickness of 200 Å or less, 50% of incident light may be reflected by the aluminum layer, and the remaining 50% of incident light may transmit through the first cathode layer CAT1 made of aluminum layer.

The second cathode layer CAT2 may include conductive resin materials. The conductive resin materials may include a domain material made of a resin material with high electron mobility and a dopant for lowering the barrier energy of the domain material. The resin materials having high electron mobility may include any one selected from Alq3, TmPyPB, Bphen, TAZ and TPB. Alq3 may be an abbreviation of 'Tris(8-hydroxyquinoline) Aluminum', and be a complex having a chemical formula of $Al(C_9H_6NO)_3$. TmPyPB may be an organic material that is an abbreviation of '1,3,5-tri(m-pyrid-3-yl-phenyl) benzene'. Bphen may be an organic material that is an abbreviation of 'Batho-phenanthroline'. TAZ may be organic material that is an abbreviation of '1,2,3-triazole'. TPB may be organic material that is an abbreviation for triphenyl bismuth. Since these organic materials have high electron mobility, they may be used in a light emitting element.

The dopant materials may include an alkali-based doping material. For example, the dopant materials may include at least any one of lithium (Li), cesium (Cs), cesium oxide $(Cs_2O_3)$, cesium nitride $(CsN_3)$, rubidium (Rb) and rubidium oxide $(Rb_2O)$. For another example, the dopant materials may include fullerene having high electron mobility. Fullerene may be a generic term for molecules in which carbon atoms are arranged in a sphere, ellipsoid or cylinder shape. For example, the dopant materials may include Buckminster-fullerene (C60) in which 60 carbon atoms are mainly bonded in the shape of a soccer ball. In addition, the dopant materials may include higher fullerenes such as C70, C76, C78, C82, C90, C94 and C96.

The second cathode layer CAT2 may have the same materials as the electron transporting layer or electron injecting layer included in the emission layer EL. However, unlike the electron transporting layer or the electron injecting layer, it is preferable that the second cathode layer CAT2 may have higher electron mobility than the electron transporting layer or the electron injecting layer. For example, the electron transporting layer or the electron injecting layer may have electron mobility of $5.0 \times 10^{-4}$ (S/m) to $9.0 \times 10^{-1}$ (S/m), whereas the second cathode layer CAT2 may have an electron mobility of $1.0 \times 10^{-3}$ (S/m) to $9.0 \times 10^{+1}$ (S/m). For this, it is preferable that the conductive resin materials included in the second cathode layer CAT2 may have a dopant content higher than that of the electron transporting layer or the electron injecting layer.

For example, the electron transporting layer or the electron injecting layer has a dopant doping concentration of 2% to 10%, whereas the second cathode layer CAT2 may be preferably a conductive resin material having a dopant doping concentration of 10% to 30%. The domain material itself, in which the dopant has a doping concentration of 0%, may have an electrical conductivity of $1.0 \times 10^{-4}$ (S/m) to $5.0 \times 10^{-3}$ (S/m). By doping 10% to 30% of dopant into the domain material, the second cathode layer CAT2 may have improved electrical conductivity of $1.0 \times 10^{-3}$ (S/m) to $9.0 \times 10^{+1}$ (S/m) to be used as a cathode electrode.

In one case, the second cathode layer CAT2 may have the same conductivity as the electron functional layer (electron transporting layer and/or electron injecting layer) of the emission layer EL. In this case, the sheet resistance of the cathode electrode CAT may be maintained at a sufficiently low value due to the first cathode layer CAT1 made of aluminum.

The third cathode layer CAT3 may be made of the same material as the first cathode layer CAT1. It is preferable that the third cathode layer CAT3 may have a sufficient thickness so that the sheet resistance of the cathode electrode CAT may be maintained at a constant value regardless of the position of the substrate SUB while not transmitting the light but reflecting all of the light. For example, the third cathode layer CAT3 may be preferably formed of a metal material having a low sheet resistance to have a relatively thicker thickness than the first and second cathode layers CAT1 and CAT2 in order to lower the overall sheet resistance of the cathode electrode CAT. For example, the third cathode layer CATS may be formed of aluminum having a thickness in a range of 2,000 Å to 4,000 Å.

The cathode electrode CAT having such a thickness and a stacked structure mentioned above may minimize reflection ratio with respect to the light incident from the bottom direction of the substrate (i.e., from the outside to the first cathode layer CAT1). A portion requiring external light reflection suppression may be a display area that may mainly affect image information. Accordingly, it is preferable to implement a low reflection structure to the cathode electrode CAT that is commonly applied over the entire display area AA. Hereinafter, description will be made with reference to arrows indicating the optical path shown in FIG. 5.

Referring to the structure of the cathode electrode CAT included into light emitting diode OLE, the incident light ① from the lower outside of the cathode electrode CAT may transpass through the anode electrode ANO and the emission layer EL which are transparent. Some of the incident light ① may be reflected at the bottom (or lower) surface of the first cathode layer CAT1 and then proceed toward the substrate 110 as the first reflected light ②. Since the first cathode layer CAT1 has a thin thickness of 200 Å or less, all of the incident light ① may not be reflected. For example, 45% of the incident light ① may be reflected as the first reflected light ②, and the remaining 55% of the incident light ① may pass through the first cathode layer CAT1. The entire amount of the transmitted light ③ passing through the first cathode layer CAT1 may pass through the transparent second cathode layer CAT2. After that, the transmitted light ③ may be reflected by the third cathode layer CAT3. Since the third cathode layer CAT3 may have a thickness of 2,000 Å to 4,000 Å, the entire amount of the transmitted light ③ may be reflected and proceed toward the substrate 110 as the second reflected light ④.

Here, by adjusting or changing the thickness of the second cathode layer CAT2, the phases of the first reflected light ② and the second reflected light ④ may be set to cancel each other. Accordingly, the reflected light luminance, which is the intensity of the reflected light incident from the outside of the cathode electrode CAT and finally reflected to the outside of the substrate 110 may be reduced to 2% or less.

Meanwhile, among the lights emitted from the emission layer EL, the amount of lights emitted toward the direction of the cathode electrode CAT and reflected by the cathode electrode CAT may be reduced by about 2% through the same mechanism. However, since the light emitted from the emission layer EL may be propagated in all directions, the amount of light reduced by the cathode electrode CAT may be only about 50% of the total amount of the light from the emission layer EL, and the remaining 50% may be emitted toward the substrate 110.

The electroluminescence display according to the first embodiment may be the bottom emission type including cathode electrode CAT of a triple layer stacked structure. The reflection ratio of the external light may be suppressed as much as possible by the structure of the cathode electrode CAT of the triple layer stacked structure. Therefore, there is no need to dispose a polarization element on the outside of the substrate 110 to reduce the external light reflection. The polarization element has a positive effect of suppressing the external light reflection, but has a negative effect of reducing the amount of light emitted from the emission layer EL by at least 50%.

In the electroluminescence display according to the first embodiment, the amount of the light emitted from the emission layer EL may be reduced by about 50% due to the cathode electrode CAT of the triple layer stack structure, but this is almost the same as the reduction in the amount of light due to the polarization element. Accordingly, the electroluminescence display according to the present disclosure may minimize the external light reflection while providing the same level of luminous efficiency without using an expensive polarization element.

Figure 6:
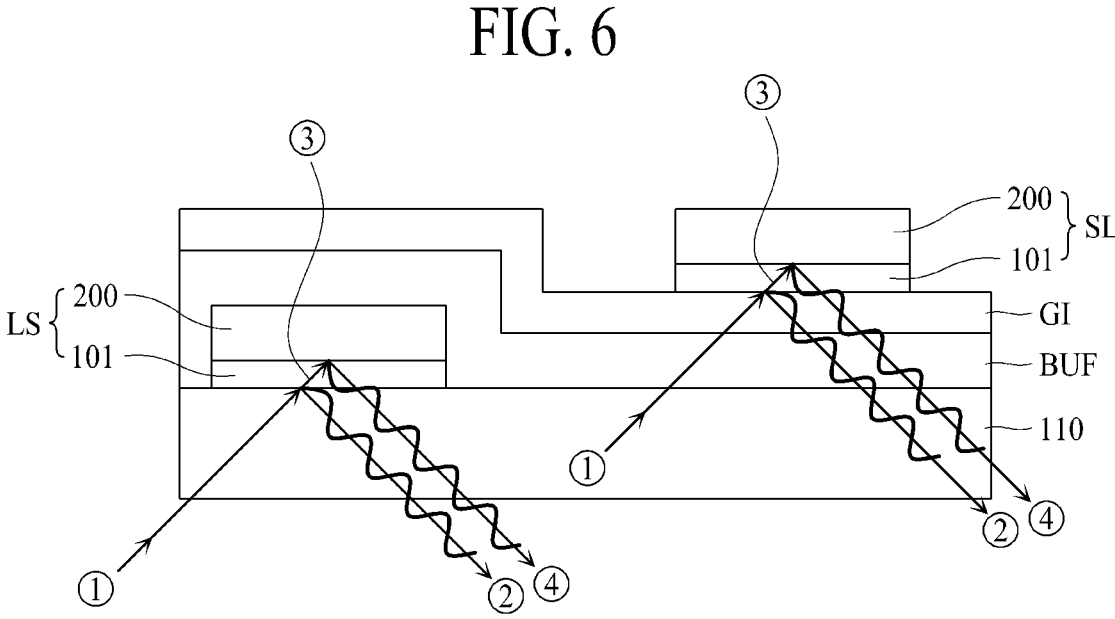
FIG. 6 is an enlarged cross-sectional view illustrating a light shielding layer and lines having a low-reflection structure in an electroluminescence display according to the first embodiment of the present disclosure.

Hereinafter, referring to FIG. 6, a structure for suppressing the reflection of the external light in the light shielding layer LS and the gate line SL will be explained. FIG. 6 is an enlarged cross-sectional view illustrating a light shielding layer having a low-reflection structure in an electroluminescence display according to the preferred embodiment of the present disclosure.

In the first embodiment, the light shielding layer LS and the gate line SL, the gate electrodes SG and DG, the source-drain electrodes SS, SD, DS and DD and the link line VDL connecting the driving drain electrode DD to the driving current line VDD may have the structure for suppressing the external light reflection. For example, the gate line SL and the light shielding layer LS including the data line DL and the driving current line VDD may have a structure in which a first metal oxide layer 101 and a second metal layer 200 may be stacked sequentially.

The first metal oxide layer 101 may include low reflective metal oxide materials with a thickness in range of 100 Å to 500 Å. The low reflective metal oxide material may be formed of molybdenum-titanium-oxide (MTO). The second metal layer 200 may include low resistance metallic materials with a thickness in range of 2,000 Å to 4,000 Å. For example, the low resistance metallic materials may include copper (Cu), aluminum (Al), silver (Ag), gold (Au) or the likes.

Here, the first metal oxide layer 101 may be an oxide layer for matching the refractive index. Since the refractive index of the first metal oxide layer 101, which is an oxide, may be significantly different from that of the second metal layer 200, which is a metallic material, the reflection of external light may be suppressed by using the phase destructive interference between the light reflected from the first metal oxide layer 101 and the light reflected from the second metal layer 200.

For example, as shown in FIG. 6, some of the incident light ① passing through the substrate 110 from the bottom side of the light shielding layer LS and the gate line SL may be reflected by the bottom (or lower) surface of the first metal oxide layer 101 and then proceed toward the substrate 110 as the first reflected light ②. The first metal oxide layer 101 is an oxide material and has relatively high transparency, and may not reflect all of the incident light ① due to a difference in refractive index at the interface with the substrate 110. For example, about 40% of the incident light ① may be reflected as the first reflected light ②, other 60% of the incident light ① may pass through the first metal oxide layer 101. The transmitted light ③ passing through the first metal oxide layer 101 may be reflected by the opaque second metal layer 200. Since the second metal layer 200 is formed of an opaque metal material, all of the transmitted light ③ may be reflected and proceed toward the substrate 110 as the second reflected light ④.

Here, by adjusting or controlling the thickness of the first metal oxide layer 101, the phases of the first reflected light ② and the second reflected light ④ may be set to cancel each other. When it is desired to selectively lower the reflection ratio of green light to which the human eye is most sensitive, the thickness of the first metal oxide layer 101 may be set to corresponding to a multiple of a half wavelength of the green light. For example, when the representative wavelength of green light is 550 nm, the first metal oxide layer 101 may be formed to have any one thicknesses of 275 Å, 550 Å, 825 Å and 1,100 Å which is a multiple of 275 nm, which is a half wavelength of green light, or any thicknesses of the integer multiple thereof. As a result, reflected light luminescence, which is the intensity of the reflected light that is incident to and reflected from the bottom outside of the light shielding layer LS and the gate line SL, may be reduced to a level of 2% or less.

The electroluminescence display according to the first embodiment may suppress the reflection of the external light at the cathode electrode CAT by applying the low-reflection structure to the cathode electrode CAT including metal material and deposited over the entire area of the substrate. In addition, by applying the low reflection structure using metal oxide layer to the light shielding layer LS and the gate line SL which is not covered by the light shielding layer LS, the reflection of the external light may be suppressed.

With these structures, a contact failure may occur at a portion indicated by a dotted circle in FIG. 4. The dotted circular portion of FIG. 4 is a portion where the data line DL formed on the light shielding layer LS and the switching source electrode SS formed on the same layer as the gate line SL are connected. Both the light shielding layer LS and the switching source electrode SS having the structure in which the first metal oxide layer 101 and the second metal layer 200 are stacked as shown in FIG. 6.

Therefore, referring to the contact portion where the data line DL and the switching source electrode SS are connected, the second metal layer 200 contact the first metal oxide layer 101 directly. That is, when the metal material and the oxide metal material come into contact with each other, since the electrical resistance of the oxide metal material is relatively high, a problem of increasing the contact resistance may occur. In the following second and third embodiments, the structures are proposed in which the problem of increasing contact resistance that may occur in the first embodiment is solved.

Second Embodiment

Figure 7:
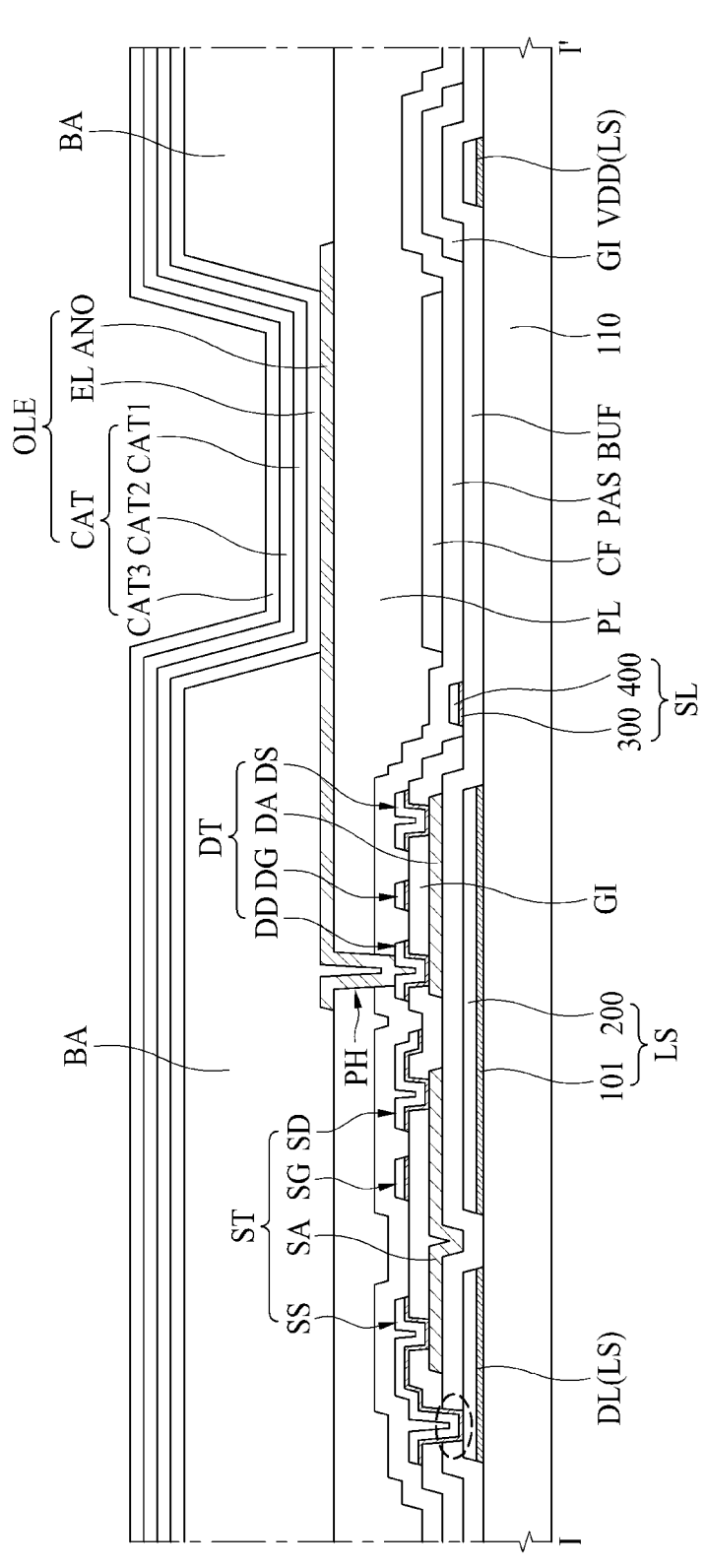
FIG. 7 is a cross-sectional view along cutting line I-I' in FIG. 3, for illustrating the low reflecting structure of the electroluminescence display according to a second embodiment of the present disclosure.

Hereinafter, referring to FIG. 7, an electroluminescence display according to the second embodiment of the present disclosure will be described. FIG. 7 is a cross-sectional view along cutting line I-I' in FIG. 3, for illustrating the low reflecting structure of the electroluminescence display according to a second embodiment of the present disclosure.

The structure of the electroluminescence according to the second embodiment of the present disclosure as shown in FIG. 7 may be very similar to the structure of the first embodiment. In the following explanation, same description for the element having the same reference numerals may not be duplicated unless necessary.

Referring to FIG. 7, a light shielding layer LS is formed on a substrate 110. The light shielding layer LS may include a light shielding region and a signal line region. The signal line region of the light shielding layer LS may include the data line DL and the driving current line VDD. In addition, the light shielding region of the light shielding layer LS may be disposed apart from the data line DL and the driving current line VDD with a predetermined distance, and having an island shape overlapping with the switching semiconductor layer SA of the switching thin film transistor ST and the driving semiconductor layer DA of the driving thin film transistor DT.

A buffer layer BUF may be stacked on the light shielding layer LS as covering the entire surface of the substrate 110. The buffer layer may include silicon nitride (SiNx) or silicon oxide (SiOx). The switching semiconductor layer SA and the driving semiconductor layer DA are formed on the buffer layer BUF. A gate insulating layer GI is deposited on the substrate 110 having the semiconductor layers SA and DA.

On the gate insulating layer GI, a switching gate electrode SG overlapped with the switching semiconductor layer SA and a driving gate electrode DG overlapped with the driving semiconductor layer DA are formed. In addition, a switching source electrode SS contacting one side of the switching semiconductor layer SA and apart from the switching gate electrode SG, and a switching drain electrode SD contacting another side of the switching semiconductor layer SA and apart from the switching gate electrode SG are formed, respectively at both outsides of the switching gate electrode SG. Further, a driving source electrode DS contacting one side of the driving semiconductor layer DA and apart from the driving gate electrode DG, and a driving drain electrode DD contacting another side of the driving semiconductor layer DA and apart from the driving gate electrode DG are formed, respectively at both outsides of the driving gate electrode DG.

The gate electrodes SG and DG and the source-drain electrodes SS, SD, DS and DD are formed on the same layer, but they are separated. In addition, the switching source electrode SS may be connected to the data line DL formed as one portion of the signal line region of the light shielding layer LS via a contact hole penetrating the gate insulating layer GI and the buffer layer BUF. Further, the driving source electrode DS may be connected to the driving current line VDD formed as another portion of the signal line region of the light shielding layer LS via another contact hole penetrating the gate insulating layer GI and the buffer layer BUF. The switching thin film transistor ST and the driving thin film transistor DT are formed on the substrate 110.

A passivation layer PAS is deposited on the substrate 110 having the thin film transistors ST and DT. A color filter CF is formed on the passivation layer PAS. A planarization layer PL is deposited over the color filter CF. A pixel contact hole PH is formed at the passivation layer PAS and the planarization layer PL for exposing some of the drain electrode DD of the drain thin film transistor DT.

An anode electrode is formed on the planarization layer PL. The anode electrode ANO is connected to the drain electrode DD of the driving thin film transistor DT via the pixel contact hole PH.

An emission layer EL is deposited on the anode electrode ANO. The emission layer EL may be deposited over the entire display area AA to cover the anode electrode ANO and the bank BA.

A cathode electrode CA is stacked to make surface contact with the emission layer EL. The cathode electrode CAT may be formed over the entire surface of the substrate 110 to be commonly connected to the emission layer EL deposited in all pixels.

In the present disclosure, a low reflection structure is provided for preventing external light from being reflected by metal elements of the display. For example, the display has a structure for preventing external light from being reflected by the cathode electrode CAT formed over the entire area of the substrate 110. In addition, the display has a structure for preventing external light from being reflected by the light shielding layer LS formed on the layer closest to the substrate 110. Furthermore, the display may have a structure for preventing external light from being reflected by the gate line SL exposed on the lower surface of the substrate 110 because the gate line SL does not overlap with the light shielding layer LS.

Figure 8:
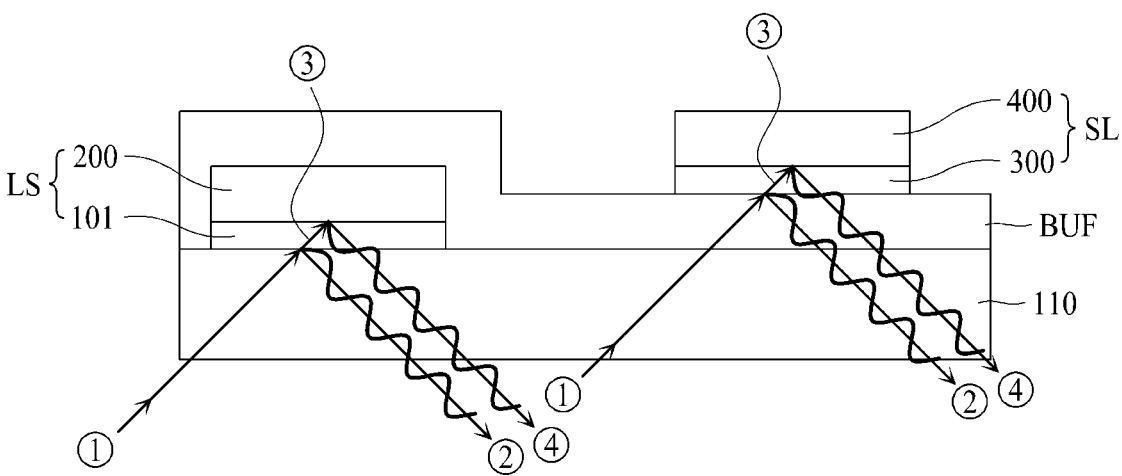
FIG. 8 is an enlarged cross-sectional view illustrating a light shielding layer and lines having a low-reflection structure in an electroluminescence display according to the second embodiment of the present disclosure.

The low reflective structure of the cathode electrode CAT may be same as that of the first embodiment. The difference from the first embodiment is in a structure for implementing low reflection in light shielding layer and the line part. Hereinafter, referring to FIG. 8, the features of the electroluminescence display according to the second embodiment of the present disclosure will be described. FIG. 8 is an enlarged cross-sectional view illustrating a light shielding layer and lines having a low-reflection structure in an electroluminescence display according to the second embodiment of the present disclosure.

Referring to FIG. 8, the electroluminescence display according to the second embodiment may have a light shielding layer LS and a gate line SL which have different structures from each other. The light shielding layer LS may have the same structure as that of the first embodiment in FIG. 6. The external light reflection at the light shielding layer LS may be suppressed by the same mechanism explained in the first embodiment. Therefore, detailed explanation about the light shielding layer LS is not duplicated.

Meanwhile, the gate line SL may have a structure in which a third metal layer 300 and a fourth metal layer 400 are sequentially stacked on the buffer layer BUF. The third metal layer 300 may be made of molybdenum (Mo), titanium (Ti) or molybdenum-titanium alloy. In particular, the third metal layer 300 has preferably a thickness in range of 100 Å to 500 Å. The metal materials such as molybdenum, titanium and molybdenum-titanium alloy are opaque and highly reflective.

The fourth metal layer 400 may be made of low-resistance metal material with a thickness in range of 2,000 Å to 4,000 Å. For example, the low-resistance metal material may include metal material such as copper (Cu), aluminum (Al), silver (Ag) or gold (Au).

At the gate line SL, the buffer layer BUF, the third metal layer 300 and the fourth metal layer 400 are stacked sequentially. Considering the light transmission characteristics of these stacked layers, a transparent layer, a semi-transmissive layer and a reflective layer are sequentially stacked from bottom to top.

For example, as shown in FIG. 8, the incident light (①) passing through the buffer layer BUF from the lower outside of the gate line SL may enter into the third metal layer 300. Since the third metal layer 300 has a thin thickness and it is semi-transmissive, only 40% of the incident light (①) may be reflected as the first reflected light (②), and the remaining 60% may pass through the third metal layer 300. The transmitted light (③) passing through the third metal layer 300 may be reflected by the opaque fourth metal layer 400. Since the fourth metal layer 400 is formed of opaque metal material, all of the transmitted light (③) may be reflected by the fourth metal layer 400 to be a second reflected light (④), and then go out of the substrate 110.

Here, by adjusting the thickness of the third metal layer 300, the phases of the first reflected light (②) and the second reflected light (④) may be set to cancel each other. For example, in the case to selectively lower the reflectance of green light which the human eye is most sensitive to, the thickness of the third metal layer 300 may be set to correspond to a multiple of half wavelength of green light. For example, when the representative wavelength of green light is set to 550 nm, the third metal layer 300 may be formed to have a thickness of 275 Å which is a multiple of 275 nm that is a half wavelength of green light. As a result, the luminance of the reflected light, the intensity of the reflected light that is incident from the lower portion of the gate line SL and reflected by the gate line SL, may be reduced to a level of 2%.

In the first embodiment, the display has a low reflection structure using the first metal oxide layer 101 as a refractive index matching layer. In the second embodiment, a low-reflection structure is obtained by using a triple-layered structure of a transparent layer, a semi-transmissive layer and a reflective layer.

Unlike the first embodiment, a contact problem does not occur at the portion indicated by the dotted circle in FIG. 7. The dotted circular portion in FIG. 7 is a portion where the data line DL formed on the light shielding layer LS and the switching source electrode SS formed on the same layer as the gate line SL are connected to each other. The data line DL has a structure in which a first metal oxide layer 101 and a second metal layer 200 are stacked as shown in FIG. 8. On the other hand, the switching source electrode SS has a structure in which the third metal layer 300 and the fourth metal layer 400 are stacked as shown in FIG. 8.

Therefore, referring to the contact portion where the data line DL is connected to the switching source electrode SS, the second metal layer 200 is directly connected to the third metal layer 300. That is, two metallic materials directly contact each other, so the problem of increasing contact resistance does not occur.

Third Embodiment

Figure 9:
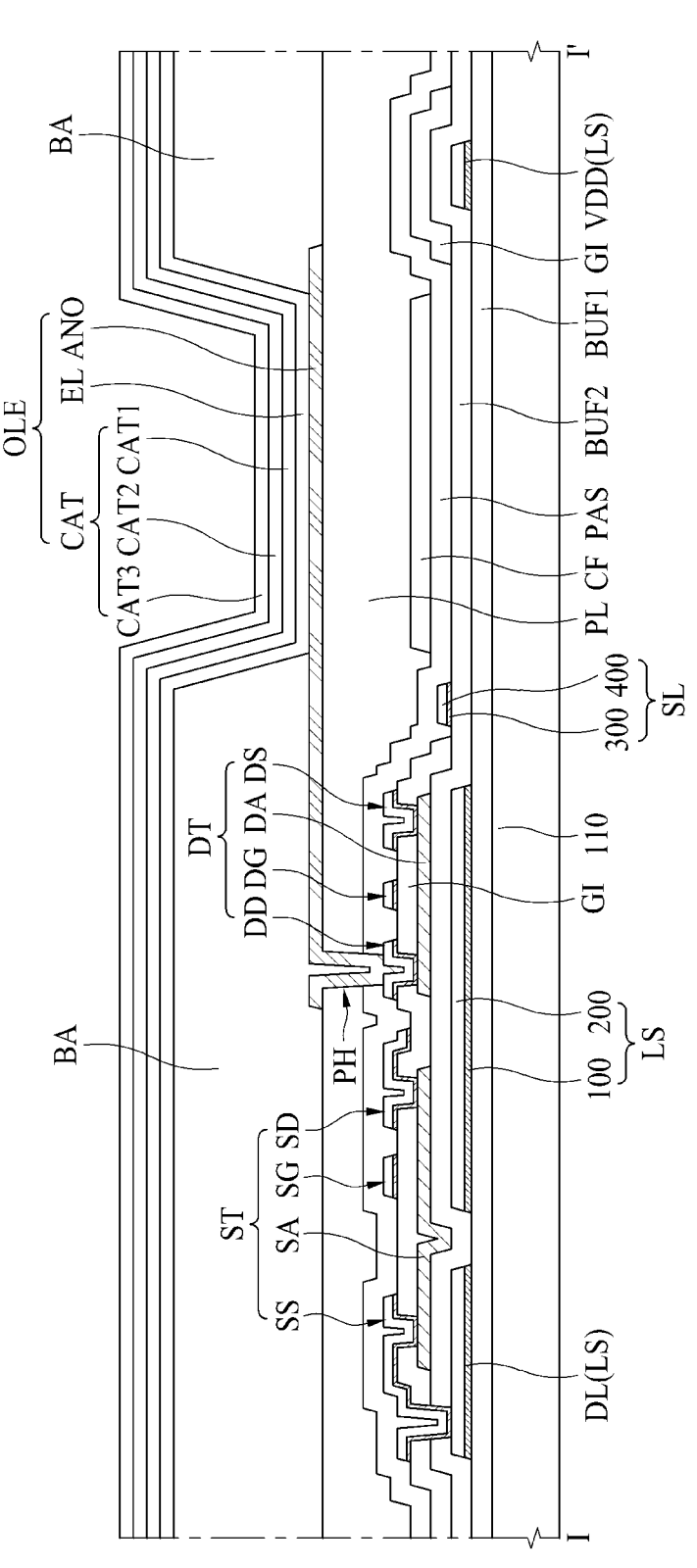
FIG. 9 is a cross-sectional view along to cutting line I-I' in FIG. 3, for illustrating the low reflecting structure of the electroluminescence display according to a third embodiment of the present disclosure.

Hereinafter, referring FIG. 9, the third embodiment of the present disclosure will be explained. FIG. 9 is a cross-sectional view along cutting line IT in FIG. 3, for illustrating the low reflecting structure of the electroluminescence display according to a third embodiment of the present disclosure.

The structure of the electroluminescence display according to the third embodiment as shown in FIG. 9 may be very similar to that of the second embodiment as shown in FIG. 7. In the following description, the same explanation will not be duplicated unless necessary.

Referring to FIG. 9, a first buffer layer BUF1 is deposited on entire surface of the substrate 110. The first buffer layer BUF1 may include silicon nitride (SiNx) or silicon oxide (SiOx).

A light shielding layer LS is formed on the first buffer layer BUF1. The light shielding layer LS may include a light shielding region and a signal line region. The signal line region of the light shielding layer LS may include the data line DL and the driving current line VDD. In addition, the light shielding region of the light shielding layer LS may be disposed apart from the data line DL and the driving current line VDD with a predetermined distance, and having an island shape overlapping with the switching semiconductor layer SA of the switching thin film transistor ST and the driving semiconductor layer DA of the driving thin film transistor DT.

A second buffer layer BUF2 may be deposited on the light shielding layer LS as covering entire surface of the substrate 110. The second buffer layer BUF2 may include silicon nitride (SiNx) or silicon oxide (SiOx). The switching semiconductor layer SA and the driving semiconductor layer DA may be formed on the second buffer layer BUF2. A gate insulating layer GI may be deposited on the substrate 110 having the semiconductor layers SA and DA.

A switching gate electrode SG overlapping with the switching semiconductor layer SA and a driving gate electrode DG overlapping with the driving semiconductor layer DA are formed on the gate insulating layer GI. In addition, a switching source electrode SS contacting one side of the switching semiconductor layer SA and apart from the switching gate electrode SG, and a switching drain electrode SD contacting another side of the switching semiconductor layer SA and apart from the switching gate electrode SG are formed, respectively at both outsides of the switching gate electrode SG. Further, a driving source electrode DS contacting one side of the driving semiconductor layer DA and apart from the driving gate electrode DG, and a driving drain electrode DD contacting another side of the driving semiconductor layer DA and apart from the driving gate electrode DG are formed, respectively at both outsides of the driving gate electrode DG.

The gate electrodes SG and DG and the source-drain electrodes SS, SD, DS and DD are formed on the same layer, but they are separated. In addition, the switching source electrode SS may be connected to the data line DL formed as one portion of the signal line region of the light shielding layer LS via a contact hole penetrating the gate insulating layer GI and the second buffer layer BUF2. Further, the driving source electrode DS may be connected to the driving current line VDD formed as another portion of the signal line region of the light shielding layer LS via another contact hole penetrating the gate insulating layer GI and the second buffer layer BUF2. The switching thin film transistor ST and the driving thin film transistor DT are formed on the substrate 110.

A passivation layer PAS is deposited on the substrate 110 having the thin film transistors ST and DT. A color filter CF is formed on the passivation layer PAS. A planarization layer PL is deposited over the color filter CF. A pixel contact hole PH is formed at the passivation layer PAS and the planarization layer PL for exposing some of the drain electrode DD of the drain thin film transistor DT.

An anode electrode is formed on the planarization layer PL. The anode electrode ANO is connected to the drain electrode DD of the driving thin film transistor DT via the pixel contact hole PH.

On the anode electrode ANO, an emission layer EL and a cathode electrode CAT are stacked sequentially. Therefore, a light emitting diode OLE is formed.

In the third embodiment, the electroluminescence display may have a structure for suppressing the external light reflection by the cathode electrode CAT deposited over the entire surface area of the substrate 110. In addition, it has a structure for preventing external light from being reflected by the light shielding layer LS and the gate line SL.

Figure 10:
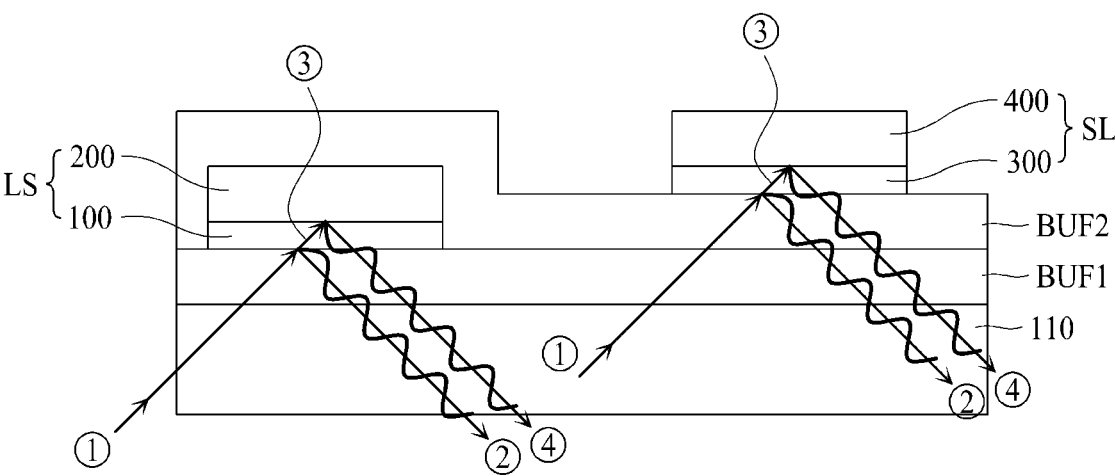
FIG. 10 is an enlarged cross-sectional view illustrating a light shielding layer and lines having a low-reflection structure in an electroluminescence display according to the third embodiment of the present disclosure.

The low-reflection structure of the cathode electrode CAT may have the same structure as the first embodiment. Difference from the first embodiment, the third embodiment provides a structure in which the light shielding layer and the signal line have the low-reflection structure. Hereinafter, referring to FIG. 10, the features of the electroluminescence display according to the third embodiment of the present disclosure will be described. FIG. 10 is an enlarged cross-sectional view illustrating a light shielding layer and lines having a low-reflection structure in an electroluminescence display according to the third embodiment of the present disclosure.

Referring to FIG. 10, the light shielding layer LS according to the third embodiment may have a structure in which a first metal layer 100 and a second metal layer 200 are sequentially stacked from bottom to top. The first metal layer 100 may be formed of a molybdenum, titanium or molybdenum-titanium alloy with a thickness in range of 100 Å to 500 Å. When a metal layer including molybdenum, titanium or a molybdenum-titanium alloy is formed very thinly, it may have the semi-transmissive property in which some of lights may be transmitted. For example, with a thin thickness of less than 500 Å, some of the lights incident (40% to 50%) may be reflected and the remaining (50% to 60%) may be transmitted through the thin metal layer.

The second metal layer 200 may include low-resistance metal material with a thickness in range of 2,000 Å to 4,000 Å. For example, the low-resistance metal material may include any one of copper (Cu), aluminum (Al), silver (Ag) or gold (Au).

At the light shielding layer LS, the first buffer layer BUF1, the first metal layer 100 and the second metal layer 200 are stacked sequentially. Considering the light transmission characteristics of these stacked layers, a transparent layer, a semi-transmissive layer and a reflective layer are sequentially stacked from bottom to top.

For example, as shown in FIG. 10, the incident light ((1)) passing through the first buffer layer BUF1 from the lower outside of the light shielding layer LS may enter into the first metal layer 100. Since the first metal layer 100 has a thin thickness and it is semi-transmissive, only 40% of the incident light ((1)) may be reflected as the first reflected light ((2)), and the remaining 60% may pass through the first metal layer 100. The transmitted light ((3)) passing through the first metal layer 100 may be reflected by the opaque second metal layer 200. Since the second metal layer 200 is formed of opaque metal material, all of the transmitted light ((3)) may be reflected by the second metal layer 200 to be a second reflected light ((4)), and then go out of the substrate 110.

Here, by adjusting the thickness of the first metal layer 100, the phases of the first reflected light ((2)) and the second reflected light ((4)) may be set to cancel each other. For example, in the case to selectively lower the reflectance of green light having wavelength of 550 nm, the thickness of the first metal layer 100 may be formed to have a thickness of 275 Å which is a multiple of 275 nm that is a half wavelength of green light. As a result, the luminance of the reflected light, the intensity of the reflected light that is incident from the lower portion of the light shielding layer LS and reflected by the light shielding layer LS, may be reduced to a level of 2%.

In addition, the gate line SL may have a structure in which a third metal layer 300 and a fourth metal layer 400 are sequentially stacked on the second buffer layer BUF2. Referring to the stack structure of the gate line SL, the first buffer layer BUF1, the second buffer layer BUF2, the third metal layer 300 and the fourth metal layer 400 are sequentially stacked from bottom to top. Under the condition of suppressing the reflected light from the light shielding layer LS using the phase destruction by adjusting the thickness of the first buffer layer BUF1, as the thickness of the second buffer layer BUF2 may be the same as that of the first buffer layer BUF1, the suppression of reflected light due to the phase destruction may be acquired at the gate line SL. In the case that it is difficult to achieve the phase destruction by the second buffer layer BUF2, the second buffer layer BUF2 may be selectively removed under the gate line SL.

The gate line SL may have a structure in which the same metal layers as those of the light shielding layer LS are stacked in the same manner, and may include a transparent first buffer layer BUF1 and/or a second buffer layer BUF2 there-under. Therefore, reflected light may be suppressed by the same mechanism as in the case of the light shielding layer LS.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment may be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
a light shielding layer disposed on a substrate, the light shielding layer including a first metal layer and a second metal layer on the first metal layer;
a first buffer layer covering the light shielding layer on the substrate;
a gate line disposed on the first buffer layer and not overlapped with the light shielding layer, the gate line including a third metal layer and a fourth metal layer on the third metal layer;
a passivation layer covering the gate line;
a planarization layer on the passivation layer; and
an emission element including a first electrode, an emission layer and a second electrode sequentially stacked on the planarization layer,
wherein the first metal layer and the third metal layer include a thickness in range of 100 Å to 500 Å,
wherein the second metal layer and the fourth metal layer include a thickness in range of 2,000 Å to 4,000 Å, and
wherein the second electrode includes:
a first cathode layer disposed on the emission layer, the first cathode layer having a first metal material with a thickness in range of 100 Å to 200 Å;
a second cathode layer disposed on the first cathode layer, the second cathode layer including a conductive resin material having a domain material and a dopant; and
a third cathode layer disposed on the second cathode layer, the third cathode layer including a second metal material with a thickness in range of 2,000 Å to 4,000 Å.

2. The electroluminescence display according to claim 1, wherein the first metal layer and the third metal layer include a metal oxide material, and
the second metal layer and the fourth metal layer include a metal material.

3. The electroluminescence display according to claim 1, wherein the first metal layer include a metal oxide material,
the second metal layer and the fourth metal layer include a first metal material, and
the third metal layer includes a second metal material.

4. The electroluminescence display according to claim 1, further comprising: a second buffer layer between the first metal layer and the substrate,
wherein the first metal layer and the third metal layer have a first metal material, and
the second metal layer and the fourth metal layer have a second metal material.

5. The electroluminescence display according to claim 4, wherein the first buffer layer and the second buffer layer are disposed between the gate line and the substrate.

6. The electroluminescence display according to claim 4, wherein the first buffer layer is patterned to selectively cover the light shielding layer,
the second buffer layer is disposed between the light shielding layer and the substrate without the first buffer layer.

7. The electroluminescence display according to claim 1, wherein the light shielding layer includes:
a light shielding region overlapping with a semiconductor layer; and
a signal line region including a data line and a driving current line, and being separated from the light shielding region.

8. The electroluminescence display according to claim 7, further comprising:
a semiconductor layer overlapping with the light shielding region of the light shielding layer on the first buffer layer;
a gate insulating layer covering the semiconductor layer; and
a gate electrode, a source electrode and a drain electrode formed of same material as the gate line on the gate insulating layer,
wherein the gate electrode overlaps with a middle portion of the semiconductor layer, the source electrode contacts one side of the semiconductor layer and the drain electrode contact another side of the semiconductor layer.

9. The electroluminescence display according to claim 8, wherein the second metal layer of the light shielding layer includes a metal material,
the third metal layer of the source electrode includes a metal material, and
the second metal layer of the data line contacts the third metal layer of the source electrode.

10. The electroluminescence display according to claim 1, wherein the first metal layer and the third metal layer include molybdenum-titanium oxide material, and
the second metal layer and the fourth metal layer include any one of copper, aluminum, silver and gold.

11. The display according to claim 1, wherein the first metal layer includes molybdenum-titanium oxide material,
the second metal layer and the fourth metal layer include any one of copper, aluminum, silver and gold, and
the third metal layer includes any one of molybdenum, titanium and molybdenum-titanium alloy.

12. The display according to claim 1, wherein the first metal layer and the third metal layer include any one of molybdenum, titanium and molybdenum-titanium alloy, and
the second metal layer and the fourth metal layer include at least one of copper, aluminum, silver and gold.

13. An electroluminescent display, comprising:
a plurality of transistors disposed on a substrate;
a light emitting element electrically coupled to at least one of the transistors;
a light shielding layer including a first layer formed of a first material having a first refractive index and a first thickness, and a second layer formed of a second material having a second refractive index and a second thickness; and
one or more signal lines electrically coupled to corresponding ones of the plurality of transistors, at least one of the signal lines including a third layer formed of a third material having a third refractive index and a third thickness and a fourth layer formed of a fourth material having a fourth refractive index and a fourth thickness,
wherein first light reflected from a first surface of the first layer and second light reflected from a first surface of the second layer contacting a second surface of the first layer being at least partially canceled out,
wherein third light reflected from a first surface of the third layer and fourth light reflected from a first surface of the fourth layer contacting a second surface of the third layer being at least partially canceled out, wherein the light emitting element includes a first electrode, an emission layer and a second electrode sequentially stacked, wherein the second electrode includes a first cathode layer disposed on the emission layer, a second cathode layer disposed on the first cathode layer, and a third cathode layer disposed on the second cathode layer, and wherein fifth light reflected from a first surface of the first cathode layer and sixth light reflected from a first surface of the third cathode layer being at least partially canceled out.

14. The electroluminescent display according to claim 13, wherein the first material and the third material include a metal oxide material and each of the first thickness and the third thickness is in range of 100 Å to 500 Å, and wherein the second material and the fourth material include a metal material and each of the second thickness and the fourth thickness is in range of 2,000 Å to 4,000 Å.

15. The electroluminescence display according to claim 13, wherein the first material includes a metal oxide material and the first thickness is in range of 100 Å to 500 Å, wherein the second material and the fourth material include a first metal material and each of the second thickness and the fourth thickness is in range of 2,000 Å to 4,000 Å, and wherein the third material includes a second metal material and the third thickness is in range of 100 Å to 500 Å.

16. The electroluminescence display according to claim 13, further comprising:

a first buffer layer between the light shielding layer and the substrate; and a second buffer layer between the first buffer layer and the at least one of the signal lines, the second buffer layer selectively covering the light shielding layer, wherein the first layer and the third layer include a first metal material and each of the first thickness and the third thickness is in range of 100 Å to 500 Å, and the second layer and the fourth layer include a second metal material and each of the second thickness and the fourth thickness is in range of 2,000 Å to 4,000 Å.

17. The electroluminescence display according to claim 13, wherein:

the first cathode layer includes a first metal material with a thickness in range of 100 Å to 200 Å, the second cathode layer includes a conductive resin material having a domain material and a dopant, and the third cathode layer includes a second metal material with a thickness in range of 2,000 Å to 4,000 Å.

18. The electroluminescence display according to claim 13, wherein the first material and the third material include molybdenum-titanium oxide material, and wherein the second material and the fourth material include any one of copper, aluminum, silver and gold.

19. The electroluminescence display according to claim 13, wherein the first material includes molybdenum-titanium oxide material, wherein the second material and the fourth material include any one of copper, aluminum, silver and gold, and wherein the third material includes any one of molybdenum, titanium and molybdenum-titanium alloy.

20. The electroluminescence display according to claim 13, wherein the first material and the third material include any one of molybdenum, titanium and molybdenum-titanium alloy, and wherein the second material and the fourth material include at least one of copper, aluminum, silver and gold.

* * * * *